(12) United States Patent
Hatamoto

(10) Patent No.: US 9,971,248 B2
(45) Date of Patent: May 15, 2018

(54) SHUTTER UNIT, LITHOGRAPHY APPARATUS, AND METHOD OF MANUFACTURING ARTICLE

(71) Applicant: CANON KABUSHIKI KAISHA, Tokyo (JP)

(72) Inventor: Atsushi Hatamoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/444,418

(22) Filed: Feb. 28, 2017

(65) Prior Publication Data

US 2017/0255106 A1    Sep. 7, 2017

(30) Foreign Application Priority Data

Mar. 3, 2016   (JP) .................................. 2016-041489

(51) Int. Cl.
*G03F 7/20* (2006.01)
(52) U.S. Cl.
CPC ........ *G03F 7/7015* (2013.01); *G03F 7/70058* (2013.01); *G03F 7/70191* (2013.01)
(58) Field of Classification Search
CPC . G03F 7/70058; G03F 7/7015; G03F 7/70191
See application file for complete search history.

(56) References Cited

U.S. PATENT DOCUMENTS

2008/0129976 A1*   6/2008   Irie ....................... G03B 27/72
355/71

FOREIGN PATENT DOCUMENTS

| JP | H04328820 A | 11/1992 |
|---|---|---|
| JP | H07010731 U | 2/1995 |
| JP | 07014442 U | 3/1995 |
| JP | H1187207 A | 3/1999 |
| JP | H11-233423 A | 8/1999 |
| JP | 2001351851 A | 12/2001 |
| JP | 2003092255 A | 3/2003 |
| JP | 2014085649 A | 5/2014 |

* cited by examiner

*Primary Examiner* — Michelle M Iacoletti
(74) *Attorney, Agent, or Firm* — Rossi, Kimms & McDowell LLP

(57) ABSTRACT

A shutter unit that opens and closes an optical path of light for a lithography apparatus is provided. The shutter unit includes a motor which rotatably drives a shaft extended along a rotation axis of the motor, and a plurality of shutter members attached to the shaft, each including a light shielding portion and a light transmissive portion. The shutter unit further includes a partition plate arranged at a location between the shutter members to avoid a portion through which a light beam passes and configured to shield light that has leaked from a front stage shutter member.

20 Claims, 5 Drawing Sheets

SHUTTER UNIT, LITHOGRAPHY APPARATUS, AND METHOD OF MANUFACTURING ARTICLE

BACKGROUND OF THE INVENTION

Field of the Invention

The present invention relates to a shutter unit, a lithography apparatus, and a method of manufacturing an article.

Description of the Related Art

In the manufacture of semiconductor devices, a reduction projection exposure apparatus that reduces a pattern of an original by a reduction projection lens and projects the reduced pattern onto a substrate is generally used. In such an apparatus, a process of performing a step movement of an XY stage which is loaded with a substrate and an exposure process are alternately repeated to transfer and print several tens of patterns of the original onto a single substrate.

In recent years, to improve the productivity of the exposure apparatus, attempts have been made to shorten the exposure cycle time by increasing the opening and closing speed of a shutter which is arranged on the optical path of the exposure light. For example, in Japanese Patent Laid-Open No. 11-233423, there is proposed an exposure apparatus that uses two rotation shutter members each including a light shielding portion and a light transmissive portion to switch between irradiation and non-irradiation of a substrate with light by controlling the rotation of the two shutter members. According to this arrangement, the shutter members can be reduced in size and weight, thereby allowing the shutter operation speed to be increased.

On a related note, since a shutter is driven to open and close, there is a gap around a shutter member. Hence, in some cases, it is impossible to completely shield the light because the exposure light can pass the shutter unit upon being reflected repetitively by this gap, and a resist applied on a substrate may be undesirably exposed to light.

SUMMARY OF THE INVENTION

The present invention provides, for example, a shutter unit for a lithography apparatus advantageous in light shielding performance.

According to one aspect of the present invention, a shutter unit that opens and closes an optical path of light for a lithography apparatus is provided. The shutter unit includes a motor configured to rotatably drive a shaft extended along a rotation axis of the motor, a plurality of shutter members attached to the shaft, each including a light shielding portion and a light transmissive portion and configured to open and close the optical path by rotating in a direction in which the light shielding portion and the light transmissive portion cross the optical path, and a partition plate arranged at a location between the plurality of shutter members to avoid a portion through which a light beam passes and configured to shield light that has leaked from a front stage shutter member.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the present invention is not limited to the following embodiments, and these embodiments are merely practical examples advantageous when carrying out the present invention. In addition, not all the combinations of features described in the embodiments are essential to the solving means of the present invention.

Figure 1A:
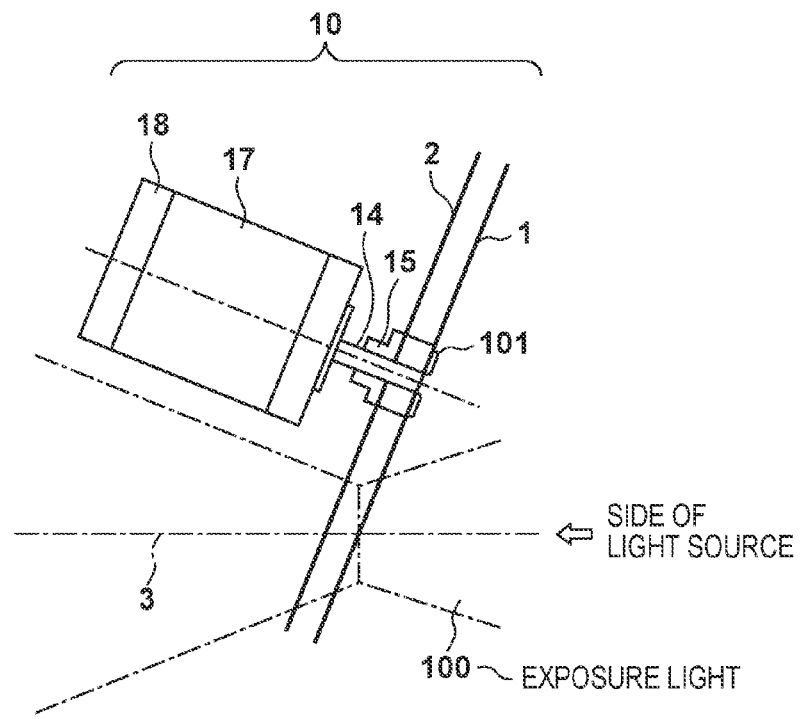
FIG. 1A is a side view of a shutter unit according to an embodiment.
Figure 1B:
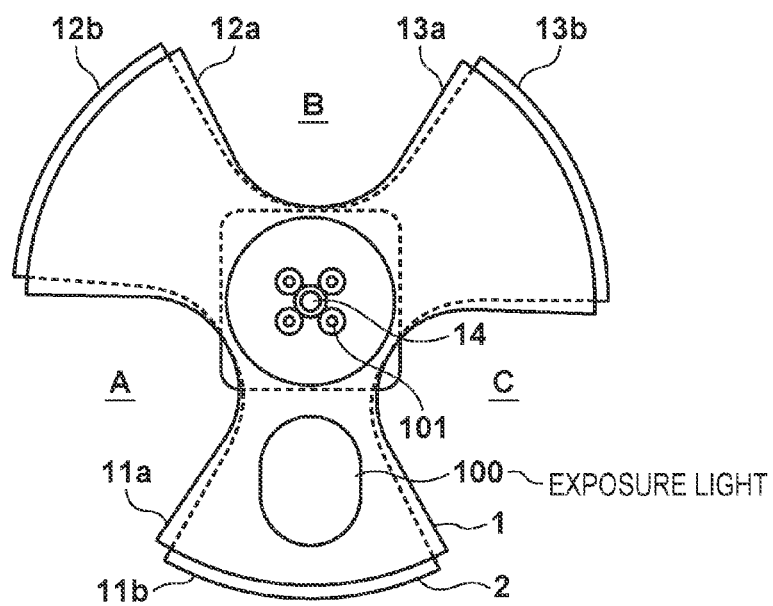
FIG. 1B is a front view of shutter members of the shutter unit according to the embodiment.

FIG. 1A is a side view of a shutter unit 10 according to the embodiment, and FIG. 1B is a front view of shutter members of the shutter unit 10 viewed from the side of a light source. The shutter unit 10 is a shutter unit that opens and closes the optical path of an exposure light for a lithography apparatus. The shutter unit 10 can include shutter members that open and close the optical path 3 by rotating in a direction to cross an optical path 3. The rotation driving of the shutter members is performed by a motor 17. Additionally, a rotary encoder 18 is arranged in the motor 17, and the motor 17 can be controlled and driven based on the output values from the rotary encoder 18.

In this embodiment, a plurality of shutter members are attached to a shaft 14 extended along a rotation axis of the motor 17 via a boss 15. Here, assume that a first shutter member 1 and a second shutter member 2 are layered and attached. The first shutter member 1 and the second shutter member 2 are fixed to the shaft 14 of the motor 17 by being fastened with bolts 101 which are threaded into the boss 15.

Each of the first shutter member 1 and the second shutter member 2 includes a light shielding portion that shields light and a light transmissive portion that transmits light. The light shielding portion and the light transmissive portion open and close the optical path 3 by rotating in a direction to cross the optical path 3. To give a more specific description of the arrangement example of the first shutter member 1 arranged toward the front when viewed from the side of the light source with reference to FIG. 1B, the first shutter member 1 is structured as a disk which has a plurality of cutouts at equal angular intervals and rotates about the rotation axis (the shaft 14). Hence, the first shutter member 1 includes light shielding portions 11a, 12a, and 13a radially extending from the rotation axis (the shaft 14) at equal intervals. Spaces A, B, and C which are formed by cutting out the portions between the light shielding portions 11a, 12a, and 13a constitute the light transmissive portions, respectively. For example, the light shielding portions 11a, 12a, and 13a of the first shutter member 1 form light shielding regions each having a central angle of 60° at intervals of 60° in a circumferential direction with respect to the rotation axis (the shaft 14). As shown in FIG. 1A, the first shutter member 1 is inserted near the second focal point of an ellipsoid mirror with respect to the optical path 3 of an exposure light 100 and arranged to sequentially shield the beam section of the exposure light 100 by rotation.

The second shutter member 2 arranged behind the first shutter member 1 when viewed from the side of the light source is formed in the same manner as the first shutter member and is attached at an angle in which the light shielding portions and the light transmissive portions overlap the light shielding portions and the light transmissive portions of the first shutter member 1, respectively. The second shutter member 2 includes light shielding portions 11b, 12b, and 13b. Although the beam section of the exposure light spreads at each location of the light shielding portions 11b, 12b, and 13b, it is arranged so that all the locations of the shutter switching operation are shadowed by the light shielding portions 11a, 12a, and 13a and none are directly hit by the beam of the exposure light 100. That is, the second shutter member 2 includes light transmissive portions of 60°+α° in the circumferential direction with respect to the rotation axis (the shaft 14) and light shielding portions 11b, 12b, and 13b at equal intervals of 120°.

In addition, of the plurality of shutter members, the shutter member (the second shutter member 2 in this embodiment) other than the shutter member (the first shutter member 1 in this embodiment) of the frontmost stage when viewed from the side of the light source includes a light absorbing member that absorbs incident light. The surface of the first shutter member serving as the frontmost stage shutter member on the side of the light source is generally given a mirror finish. This is because if the light shielding portions absorb the heat of the exposure light when the shutter is closed, the light shielding portions may melt or become deformed. In contrast, the shutter member (the second shutter member 2 in this embodiment) other than the frontmost stage shutter member includes a light absorbing member with black plating. Hence, it can enhance the reduction of leakage light.

Figure 2:
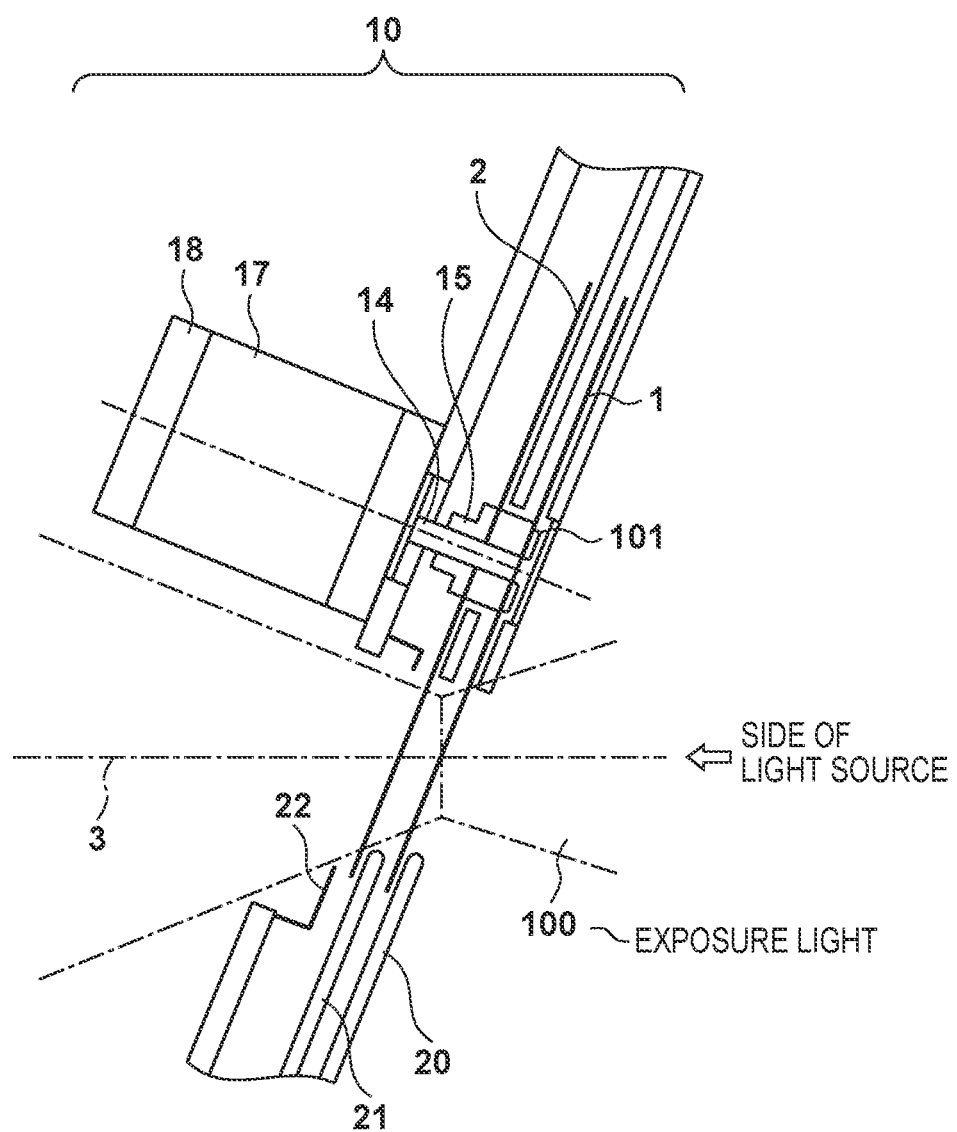
FIG. 2 is a sectional view of the shutter unit according to the embodiment.

The arrangement of a partition plate according to the embodiment will be described next with reference to FIG. 2. The shutter unit 10 includes, at each location between the shutter members, a partition plate 21 to shield light that leaks from the front stage shutter member (the first shutter member 1). The intensity of leakage light can be greatly reduced by interposing this partition plate 21 between the shutter members.

Additionally, in this embodiment, a second partition plate 20 is arranged in front of (on the incident side of) the first shutter member 1. Furthermore, a third partition plate 22 is arranged behind (the exit side of) a rearmost stage shutter member (the second shutter member 2 in this embodiment). The partition plate 21, the second partition plate 20, and the third partition plate 22 are arranged so as to avoid the portions where the beam of the exposure light passes. For example, an opening through which the beam of the exposure light 100 passes is provided in each of the partition plate 21, the second partition plate 20, and the third partition plate 22, and no light path is formed for the beam of the exposure light 100 other than each of these openings.

Figure 5:
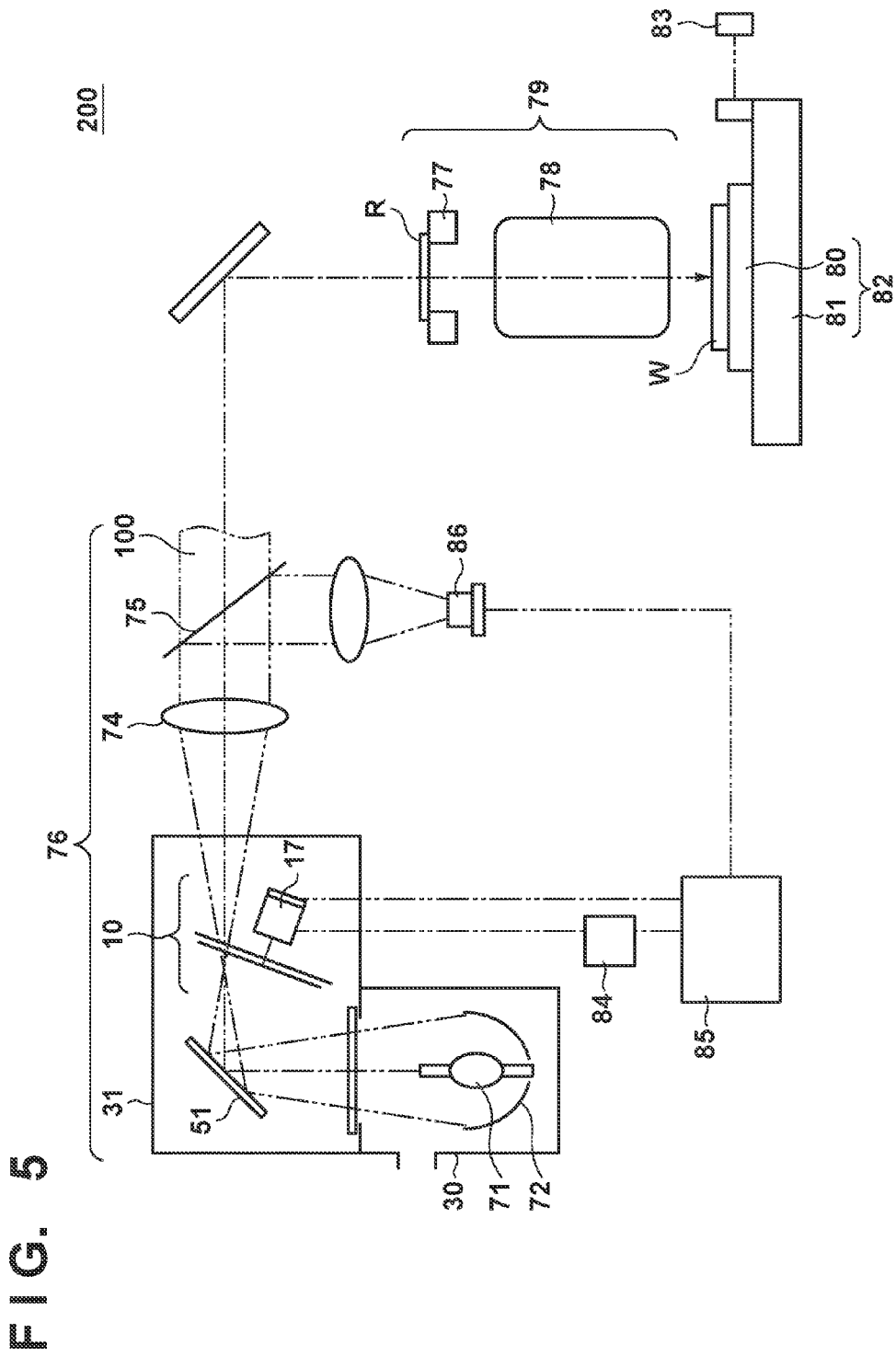
FIG. 5 is a view of the schematic arrangement of an exposure apparatus according to the embodiment.

FIG. 5 is a view showing the schematic arrangement of an exposure apparatus 200 as an example of a lithography apparatus in which the shutter unit 10 according to the embodiment is adopted. Although the shutter unit 10 is used in an exposure apparatus in this embodiment, it is also usable in other lithography apparatuses that form a pattern of an original on a substrate such as an imprint apparatus.

In FIG. 5, the exposure apparatus 200 includes an illumination optical system 76 and a projection optical system 79. The illumination optical system 76 that illuminates an original (reticle) can include a lamp chamber 30, a shutter chamber 31, a lens 74, and a half mirror 75. In the illumination optical system 76, the lamp chamber 30 can include a mercury lamp 71 that serves as the light source and an ellipsoid mirror 72 that collects the exposure light 100 generated from the mercury lamp 71. The shutter chamber 31 can include the aforementioned shutter unit 10 and a deflection mirror 51 that bends the exposure light emitted from the lamp chamber 30. Note that since thermal fluctuations will occur in the light source if the exposure light reflected by the light shielding portions travels back to the light source, the rotation axis of the motor is preferably arranged obliquely with respect to the optical path of the exposure light so no reflection light from the light shielding portions will travel back to the light source. The lens 74 has a function to collimate the light beam narrowed by the ellipsoid mirror 72 into a parallel beam again, and the half mirror 75 has a function to extract a portion of the exposure light 100.

The exposure apparatus 200 can further include a reticle stage 77 on which a reticle R is placed. The reticle R serves as an original that has a pattern to be transferred to each shot region of a wafer W serving as a substrate. The illumination optical system 76 illuminates the reticle R placed on the reticle stage 77. The projection optical system 79 can include a reduction projection lens 78 that reduces and projects the pattern on the reticle R to the wafer W.

Furthermore, the exposure apparatus 200 can include a wafer stage 82 which includes a 19Z tilt stage 80 that loads and moves the wafer W in the light axis direction and an XY stage 81 that moves the wafer W in the XY direction. The location of the XY stage 81 is measured by a laser interferometer 83.

A control unit 85 can control the rotation of the motor 17 of the shutter unit 10 via a motor driver 84. This allows the control unit 85 to control the opening time of the shutter unit 10 so that the cumulative exposure amount of the wafer W becomes a predetermined value based on outputs from a photodetector 86 which detects a portion of the exposure light 100 extracted by the half mirror 75.

The pattern region drawn on the reticle R is exposed by a predetermined exposure amount of light, and the pattern is reduced to a predetermined magnification (for example, ¼ or ⅕) by the projection optical system 79, and transferred to the wafer W held on the wafer stage 82. The pattern region of the reticle R is transferred to a photoresist on the wafer W by scanning the reticle R and the wafer W with respect to the projection optical system 79. This scan exposure is repetitively performed to a plurality of transfer regions on the wafer W. Since scan exposure is repetitively performed on the plurality of transfer regions, the leakage light when the light is shielded by the shutter unit 10 according to the embodiment is reduced.

Figure 4:
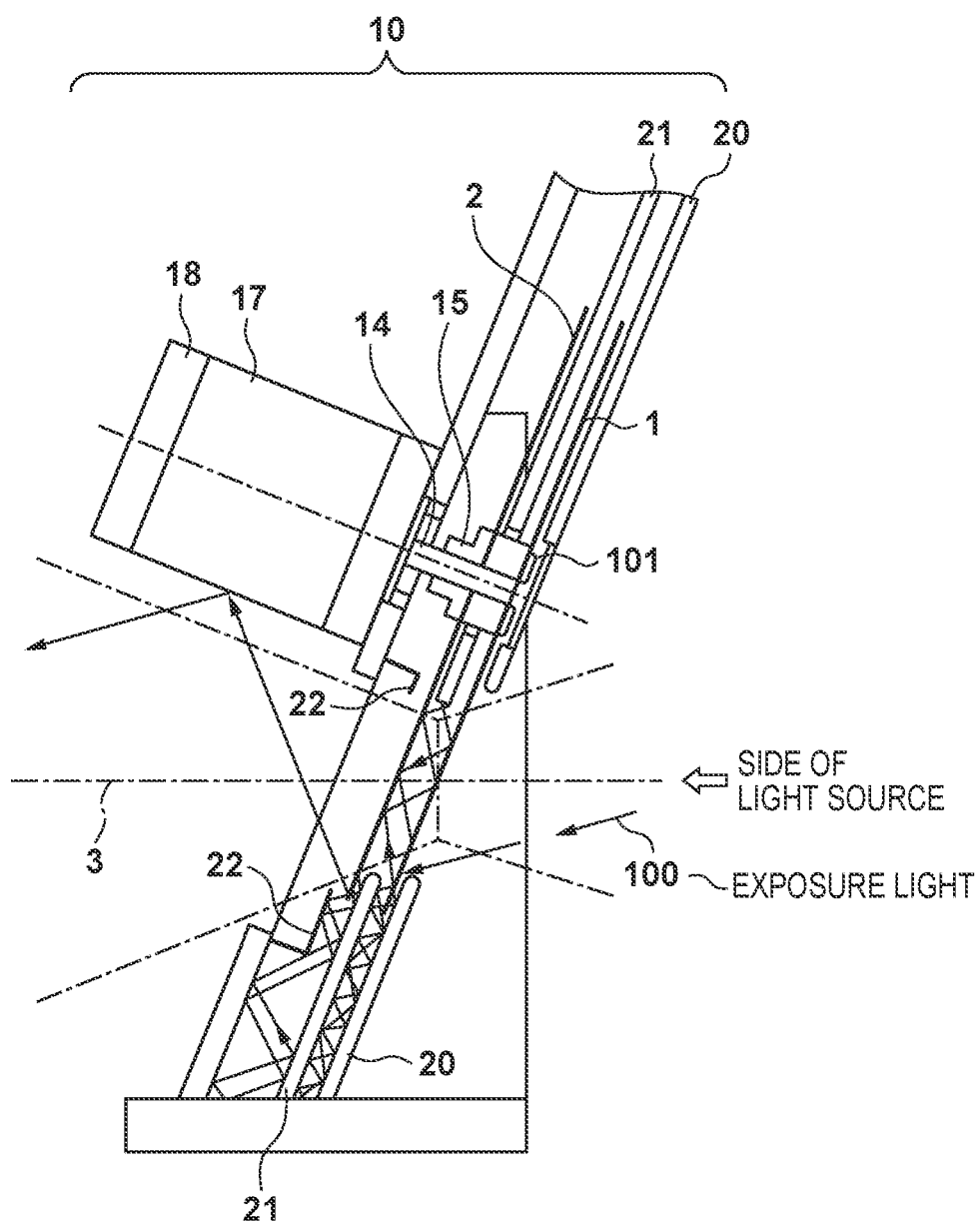
FIG. 4 is a view for explaining the action of the shutter unit according to the embodiment.

The action of the shutter unit 10 according to the embodiment will be described below with reference to FIG. 4. The exposure light 100 passes the shutter unit 10 along the optical path 3, but when it is shielded by the shutter unit 10, a large portion of the exposure light 100 is reflected by the surface of the first shutter member 1 and does not reach the substrate surface. However, for example, the exposure light 100 may include light that enters the shutter unit 10 from a beam other than the ideal light beam due to diffused reflection in the middle of the path from the light source. In this case, a portion of the exposure light 100 may pass through the opening of the partition plate 21 upon being repetitively reflected between the first shutter member 1 and the second partition plate 20. The light having passed through the opening in this way will reach the second shutter member 2 arranged further ahead. The intensity of this light is reduced by a light absorbing member on the surface of the second shutter member 2. Furthermore, the light reflected by the second shutter member 2 is repetitively reflected between the second shutter member 2 and the first shutter member 1, the second shutter member 2 and the partition plate 21, and the second shutter member 2 and the third partition plate 22. The intensity of this light can further be reduced by such a repetitive reflection.

Figure 3:
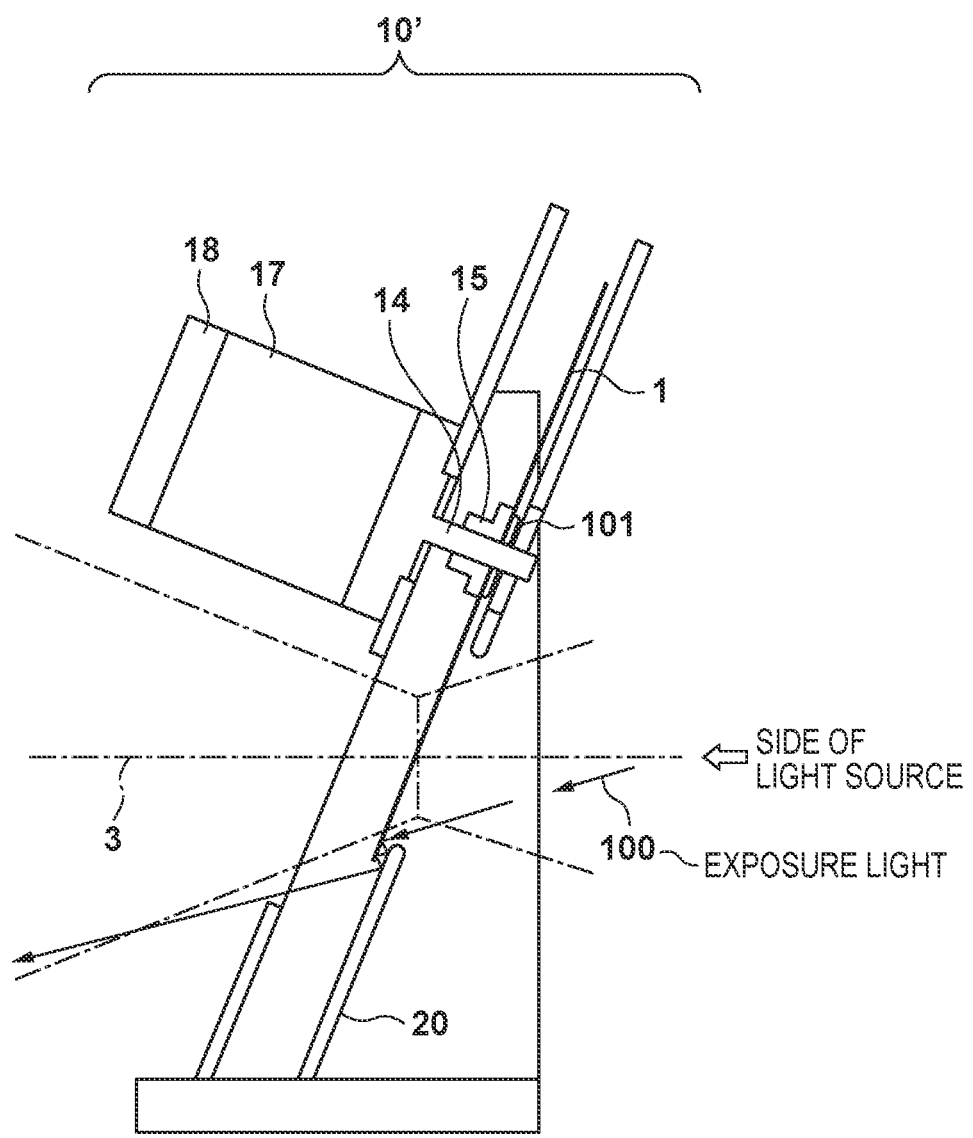
FIG. 3 is a view showing the arrangement of a conventional shutter unit.

FIG. 3 shows an example of the arrangement of a conventional shutter unit 10'. The shutter unit 10' does not include the second shutter member 2, the partition plate 21, and the third partition plate 22 that are provided in the shutter unit 10 according to the embodiment. According to the simulation by the present inventor, the arrangement shown in FIG. 4 according to this embodiment could reduce the intensity of leakage light to 5% or less with respect to the arrangement of the related art shown in FIG. 3.

Although an arrangement including the first shutter member 1, the second shutter member 2, and three partition plates has been described the above-described embodiment, the present invention is not limited to this. For example, it is easily understandable for those skilled in the art that the intensity of the leakage light generated when light is shielded by the shutter unit can be further suppressed by adding a partition plate and a third shutter member manufactured using a light absorbing member to the rotation axis of the motor.

Note that the above embodiment has described an example of a shutter unit that opens and closes the optical path of the exposure light in the exposure apparatus. As described above, the shutter unit according to the present invention is applicable to an imprint apparatus. In the case of an imprint apparatus, a shutter unit can be used, for example, to open and close the optical path of the light for curing an imprint material.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of transferring the pattern of an original onto a substrate using the above-described lithography apparatus (an exposure apparatus, an imprint apparatus, a drawing apparatus, or the like), and a step of processing the substrate onto which the pattern has been transferred in the preceding step. This manufacturing method further includes other known steps (oxidation, deposition, vapor deposition, doping, planarization, etching, resist removal, dicing, bonding, packaging, and the like). The method of manufacturing the article according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-041489, filed Mar. 3, 2016, which is hereby incorporated by reference herein in its entirety.

What is claimed is:

1. A shutter unit for a lithography apparatus for switching between transmitting and shielding light from a light source, the shutter unit comprising:

a motor configured to rotatably drive a shaft;
a plurality of shutter members attached to the shaft, each including a light shielding portion, and configured to shield the light by rotating the shaft to dispose the light shielding portion in a path of the light; and
a first partition plate disposed between the plurality of shutter members and configured to shield light leaking from one shutter member, among the plurality of shutter members, disposed in front of the first partition plate in relation to a side of the light source,
wherein another shutter member, among the plurality of shutter members, is disposed behind the first partition plate in relation to the side of the light source.

2. The shutter unit according to claim 1, further comprising a second partition plate disposed in front of a frontmost stage shutter member of the plurality of shutter members in relation to the side of the light source.

3. The shutter unit according to claim 2, further comprising a third partition plate disposed behind a rearmost stage shutter member of the plurality of shutter members in relation to the side of the light source.

4. The shutter unit according to claim 1, wherein one of the plurality of shutter members, other than a frontmost stage shutter member thereof, in relation to the side of the light source, includes a light absorbing member configured to absorb incident light.

5. The shutter unit according to claim 1, wherein the shaft is obliquely arranged with respect to the path of light.

6. The shutter unit according to claim 1, wherein:
the plurality of shutter members radially extend with the shaft as a center, and
the one shutter member, which is disposed in front of the another shutter member in relation to the side of the light source, is larger than the another shutter member in a circumferential direction with respect to the center.

7. A lithography apparatus for forming a pattern of an original on a substrate, the lithography apparatus comprising:
an illumination optical system configured to illuminate the original, and including a shutter unit configured to switch between transmitting and shielding light from a light source,
wherein the shutter unit includes:
a motor configured to rotatably drive a shaft;
a plurality of shutter members attached to the shaft, each including a light shielding portion, and configured to shield light by rotating the shaft to dispose the light shielding portion in a path of the light; and
a partition plate disposed between the plurality of shutter members and configured to shield light leaking from one shutter member, among the plurality of shutter members, disposed in front of the partition plate in relation to a side of the light source,
wherein another shutter member, among the plurality of shutter members, is disposed behind the partition plate in relation to the side of the light source.

8. The lithography apparatus according to claim 7, wherein:
the lithography apparatus is an imprint apparatus that forms a pattern on a substrate using an original and an imprint material, and
the shutter unit is configured to switch between transmitting and shielding light for curing the imprint material.

9. A method of manufacturing an article, the method comprising the steps of:
forming a pattern of an original on a substrate using a lithography apparatus; and processing the substrate on which the pattern has been formed in the forming step, wherein the lithography apparatus includes an illumination optical system configured to illuminate the original, wherein the illumination optical system includes a shutter unit configured to switch between transmitting and shielding light from a light source, wherein the shutter unit includes:
- a motor configured to rotatably drive a shaft;
- a plurality of shutter members attached to the shaft, each including a light shielding portion, and configured to shield light by rotating the shaft to dispose the light shielding portion in a path of the light; and
- a partition plate disposed between the plurality of shutter members and configured to shield light leaking from one shutter member, among the plurality of shutter members, disposed in front of the partition plate in relation to a side of the light source, wherein another shutter member, among the plurality of shutter members, is disposed behind the partition plate in relation to the side of the light source.

10. The method according to claim 9, wherein:
the lithography apparatus is an imprint apparatus that forms a pattern on a substrate using an original and an imprint material, and
the shutter unit is configured to switch between transmitting and shielding light for curing the imprint material.

11. A shutter unit for a lithography apparatus form forming a pattern of an original on a substrate, the shutter unit comprising:
a first plate having a light passing region through which light passes; and
a shutter having a first light shielding portion and a second light shielding portion overlapping each other,
wherein the first light shielding portion and the second light shielding portion are disposed so that the light passing region and part of the first plate are sandwiched between the first light shielding portion and the second light shield portion while the shutter is closed.

12. The shutter unit according to claim 11, wherein:
the first light shielding portion, the first plate, and the second light shielding portion are arranged in this order from a light incident side, and
light leaking, in a state where the shutter is closed, becomes reflected between the first light shielding portion and the second light shielding portion and between the second light shielding portion and the first plate.

13. The shutter unit according to claim 11, further comprising:
a motor having a rotary shaft fixed to the first light shielding portion and the second light shielding portion,
wherein the rotary shaft passes through the first plate, and
wherein the first plate is disposed between the first light shielding portion and the second light shielding portion.

14. The shutter unit according to claim 13, wherein the rotary shaft is obliquely arranged with respect to a path of light passing through the light passing region so that the first light shielding portion and the second light shielding portion are obliquely arranged with respect to the path of light passing through the light passing region.

15. The shutter unit according to claim 13, wherein:
the first light shielding portion and the second light shielding portion radially extend with the rotary shaft as a center, and
the first light shielding portion is larger than the second shielding portion in a circumferential direction with respect to the center.

16. The shutter unit according to claim 11, wherein the first plate has a first opening comprising the light passing region.

17. The shutter unit according to claim 16, wherein:
the shutter unit further includes a second plate having a second opening, and a third plate having a third opening,
the second plate, the first light shielding portion, the first plate, the second light shielding portion, and the third plate are arranged in this order from a light incident side, and
light leaking, in a state where the shutter is closed, reflects between the second light shielding portion and the third plate.

18. The shutter unit according to claim 11, wherein the second light shielding portion includes a light absorbing member configured to absorb light.

19. A lithography apparatus for forming a pattern of an original on a substrate, the lithography apparatus comprising:
an illumination optical system configured to illuminate the original and including a shutter unit,
wherein the shutter unit includes:
- a plate having a light passing region through which light passes; and
- a shutter having a first light shielding portion and a second light shielding portion that overlap each other,
wherein the first light shielding portion and the second light shielding portion are disposed so that the light passing region and part of the plate are sandwiched between the first light shielding portion and the second light shield portion while the shutter is closed.

20. The lithography apparatus according to claim 19, wherein:
the lithography apparatus is an imprint apparatus that forms a pattern on a substrate using an original and an imprint material, and
the shutter unit is configured to switch between transmitting and shielding light for curing the imprint material.

* * * * *